(12) United States Patent
Abe

(10) Patent No.: US 6,229,661 B1
(45) Date of Patent: May 8, 2001

(54) DIGITAL DATA RECORDING AND REPRODUCING APPARATUS AND DIGITAL DATA REPRODUCING APPARATUS

(75) Inventor: Takafumi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/318,173

(22) Filed: May 25, 1999

(30) Foreign Application Priority Data

May 27, 1998 (JP) .................................................. 10-145442

(51) Int. Cl.⁷ .............................. G11B 5/09; G11B 27/36
(52) U.S. Cl. .................................................. 360/53; 360/31
(58) Field of Search ........................................ 360/31, 53

Primary Examiner—W. Chris Kim
Assistant Examiner—Regina Y. Neal

(74) Attorney, Agent, or Firm—Frommer Lawrence & Haug, LLP; William S. Frommer

(57) ABSTRACT

This invention provides a digital data recording and reproducing apparatus and a digital data reproducing apparatus for recording data to a recording medium which can handle instrumental data as the data. In the digital data recording and reproducing apparatus according to the invention, in parallel with the writing of data to a magnetic tape, the written data is read. An error correction code of the read data is decoded and whether errors exceeding an error correcting ability which the code has exist or not is checked. In case of handling normal data, in this case, the same data is rewritten by a retrying process. In case of handling instrumental data, the retrying process is not performed and subsequent to the data having uncorrectable errors, the next data is written. In case of reading data as well, data in which uncorrectable errors exist is also read and transferred as it is.

8 Claims, 14 Drawing Sheets

DIGITAL DATA RECORDING AND REPRODUCING APPARATUS AND DIGITAL DATA REPRODUCING APPARATUS

BACKGROUND OF THE INVENTION

1. Field of the Invention

The invention relates to a digital data recording and reproducing apparatus and digital data reproducing apparatus for recording digital data that is supplied continuously in the time axis and includes many noises to a magnetic tape and reproducing the digital data from the magnetic tape.

2. Description of the Related Art

There has been known a magnetic tape recording and reproducing apparatus (hereinafter, referred to as a data recorder) including as one element a driving apparatus in which a cassette tape on which digital data is recorded can be loaded and being connected to a host computer via an interface, so that the driving apparatus is used as an external storing device of computer. One of the data recorders, a data recorder of a helical scan type for recording digital data onto a cassette tape by rotary heads has been known.

Such a data recorder is connected to a host computer via an interface unit by an interface of, for example, the SCSI (Small Computer System Interface) standard. Since the interface unit is recognized as a data recorder by the host computer, it has a function (called a formatter) for making file format onto the tape and performing a transmission and a reception of the data thereon. A buffer memory to temporarily hold data that is transferred between the host computer and the data recorder is provided in the interface unit.

When signal processes such as recording and reproduction of data are performed and errors which cannot be corrected (uncorrected error) are generated, by using the data temporarily stored in the buffer memory, a re-recording/re-reproduction (write retry/read retry) can be performed to the magnetic tape. As such a method, for example, when the data is read out from the buffer memory and is recorded onto the tape on a buffer unit basis, the write retry is performed in a portion (including a unrecorded area) that has been progressed from an area which could not be recorded toward an end direction of the tape and corresponds to a portion other than a data area to be recorded. Upon reproduction, the read retry is performed from an area which could not be reproduced.

In such a data recorder, besides the ordinary data that is transferred between the data recorder and the computer as mentioned above, data which is obtained by an observation, a measurement, and the like is handled. For example, there are data that is transmitted from a satellite, distortion measurement data which is obtained by measuring by using an ultrasonic wave in a tunnel, and the like. Such data is called instrumental data. The instrumental data includes much noises and at the time of actual use, a large amount of data to be abandoned is generated. The instrumental data is continuously supplied to the data recorder because of a nature of the data.

In the data recorder, to certainly write data onto a magnetic tape, upon recording, the data written on the magnetic tape is read just after the recording and an error check is performed. If the data is not correctly written as a result of the error check, the write retrying process is performed as mentioned above.

However, in case of handling the instrumental data, even if a large amount of data which contains a lot of noise and is actually abandoned is generated, since each data is essential, it is necessary to write the data continuously in the time axis in association with supplying the data in the time axis. As the result, there is a problem such that the execution of the write retrying process is unpreferable.

OBJECTS AND SUMMARY OF THE INVENTION

It is, therefore, an object of the invention to provide a digital data recording and reproducing apparatus and digital data reproducing apparatus suitable for handling instrumental data.

According to an aspect of the invention, there is provided a digital data recording and reproducing apparatus for recording or reproducing inputted digital data, comprising:

a memory to temporarily store said inputted digital data;

recording processing means for performing an encoding for error correction to the digital data read out from said memory and recording the encoded digital data onto a recording medium;

reproduction processing means for reproducing said encoded signal recorded on said recording medium and performing a decoding of said error correction;

confirming means for, when recording a signal onto said recording medium, instantaneously reproducing the recorded signal and confirming an error state of the signal recorded on said recording medium;

drive control means for controlling a driving of said recording medium; and a system controller for controlling said memory, said recording processing means, said reproduction processing means, said confirming means, and said drive control means so that the signal is recorded onto or reproduced from said recording medium in response to a control signal that is selected, wherein said apparatus further comprises:

retry means for controlling said memory, said recording processing means, and said drive control means when the signal is recorded onto said recording medium in a manner such that the digital data which had been stored in said memory and has already been read out for recording from said memory is again read out and is again recorded onto said recording medium by said recording processing means in accordance with a confirmation result of said confirming means and for controlling said reproduction processing means and said drive control means when the signal is reproduced from said recording medium in a manner such that an area on said recording medium which has already been reproduced is again reproduced in accordance with a result of said error correction by said reproduction processing means;

mode selecting means for selecting a first processing mode and a second processing mode in accordance with a kind of said inputted digital data or said digital data which is reproduced from said recording medium; and retry processing control means for controlling on the basis of a selection result of said mode selecting means in a manner such that a retrying process by said retry means is executed in case of said first processing mode and the retrying process by said retry means is not performed in case of the second processing mode.

According to another aspect of the invention, there is provided a digital data reproducing apparatus for reproducing a signal recorded on a recording medium, comprising:

reproduction processing means for reproducing an error correction encoded signal recorded on said recording medium and performing a decoding of said error correction;

drive control means for controlling a driving of said recording medium; and a system controller for controlling said reproduction processing means and said drive control means so as to reproduce the signal from said recording medium in response to a control signal that is selected, wherein said apparatus further comprises:

retry means for controlling said reproduction processing means and said drive control means when the signal is reproduced from said recording medium in a manner such that an area on said recording medium which has already been reproduced is again reproduced in accordance with a result of said error correction of said reproduction processing means;

mode selecting means for selecting either a first processing mode or a second processing mode in accordance with a kind of digital data that is reproduced from said recording medium; and retrying process control means for controlling on the basis of a selection result of said mode selecting means in a manner such that a retrying process by said retry means is executed in case of said first processing mode and the retrying process by said retry means is not performed in case of said second processing mode.

As mentioned above, according to the invention, whether the mode is the mode in which the instrumental data is handled or the mode in which the ordinary data is handled is selected by the mode selecting means. When it is decided that the ordinary data is handled on the basis of the selection result, the retrying process is performed. When the instrumental data in which the continuous process is a necessary is handled, the retrying process is not performed. Thus, it is suitable to handle the instrumental data.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

An embodiment of the invention will now be described hereinbelow. First, to make it easy to understand, a data recorder to which the invention can be applied and a format of a magnetic tape will be described. The data recorder which will be explained here records/reproduces digital data to/from a cassette tape by rotary heads.

Figure 1:
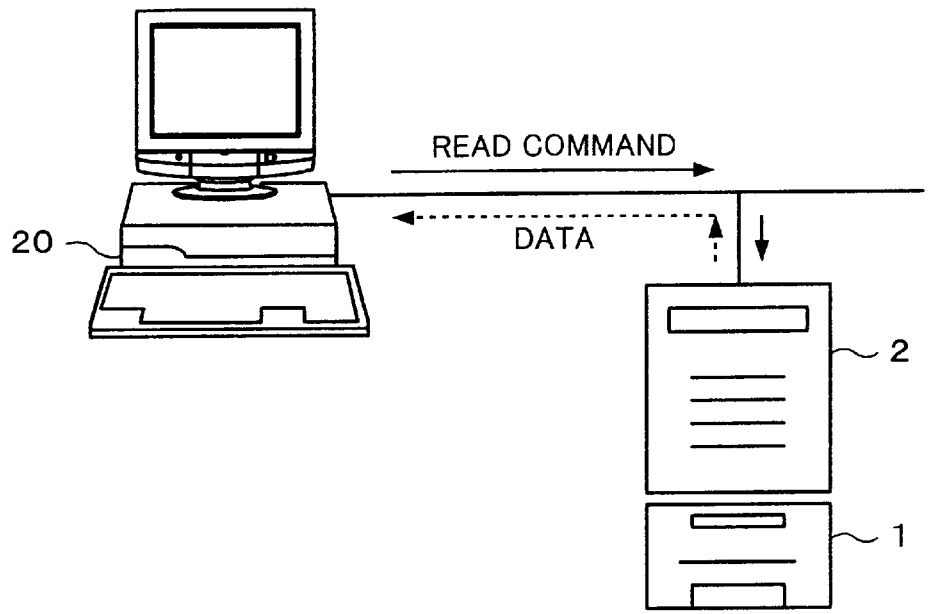
FIG. 1 is a schematic diagram showing an outline of a use form of a data recorder in an embodiment.

FIG. 1 schematically shows a use form of the data recorder in the embodiment of the invention. The data recorder is constructed by a tape drive controller 1 and a digital information recorder 2 as two units which are vertically piled. Those two units are connected by a predetermined cable and transmit and receive data and commands. Various buttons to operate the data recorder, various display devices to display a status, and the like are provided in the front of the tape drive controller 1. Further, connectors to transmit and receive data and commands to/from the outside are provided for the tape drive controller 1 and digital information recorder 2. For example, the SCSI or RS-232C is used as an interface.

The data recorder is connected to, for example, a host computer 20 and is used. For instance, the SCSI is used as an interface to connect the host computer 20 and the data recorder. When the host computer 20 supplies, for example, a read command to the data recorder, the data recorder outputs the data to the host computer 20.

Figure 2:
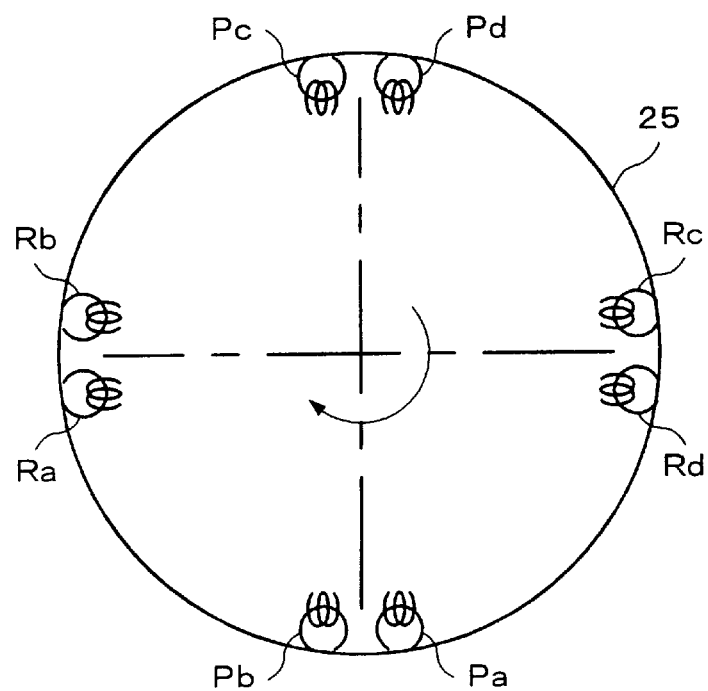
FIG. 2 is a schematic diagram showing an example of a head arrangement of a digital information recorder.

The digital information recorder 2 records/reproduces digital data to a cassette tape by rotary heads. FIG. 2 shows an example of an arrangement of the heads of the recorder 2. Four heads Ra, Rb, Rc, and Rd for recording and four heads Pa, Pb, Pc, and Pd for reproduction are attached to a drum 25 which rotates at a predetermined speed, respectively.

The heads Ra and Rb are attached to positions which are close to each other. Similarly, a pair of the heads Rc and Rd, a pair of the heads Pa and Pb, and a pair of the heads Pc and Pd are attached to the positions which are close to each other, respectively. Those heads are arranged so that the extending directions (called azimuths) of gaps between the respective two close heads are made different. The heads Ra and Rc which face each other at an interval of 180° have a first azimuth. Similarly, the heads Rb and Rd which face each other at an interval of 180° have a second azimuth. The heads Pa and Pc have the first azimuth and the heads Pb and Pd have the second azimuth. The reason why the azimuths are made different is to prevent the generation of crosstalks between the adjacent tracks. The close two heads are actually realized as a head with an integrated structure called double azimuth heads.

A tape (for example, having a width of ½ inch) pulled out from the cassette is obliquely wrapped around the peripheral surface of the drum 25 in an angle range that is slightly larger than 180°. The tape is fed at a predetermined speed. Therefore, upon recording, the heads Ra and Rb scan the tape in the former half of a period during which the drum 25 rotates once and the heads Rc and Rd scan the tape in the latter half thereof. Upon reproduction, the heads Pa and Pb scan the tape and the heads Pc and Pd subsequently scan the tape.

Figure 3:
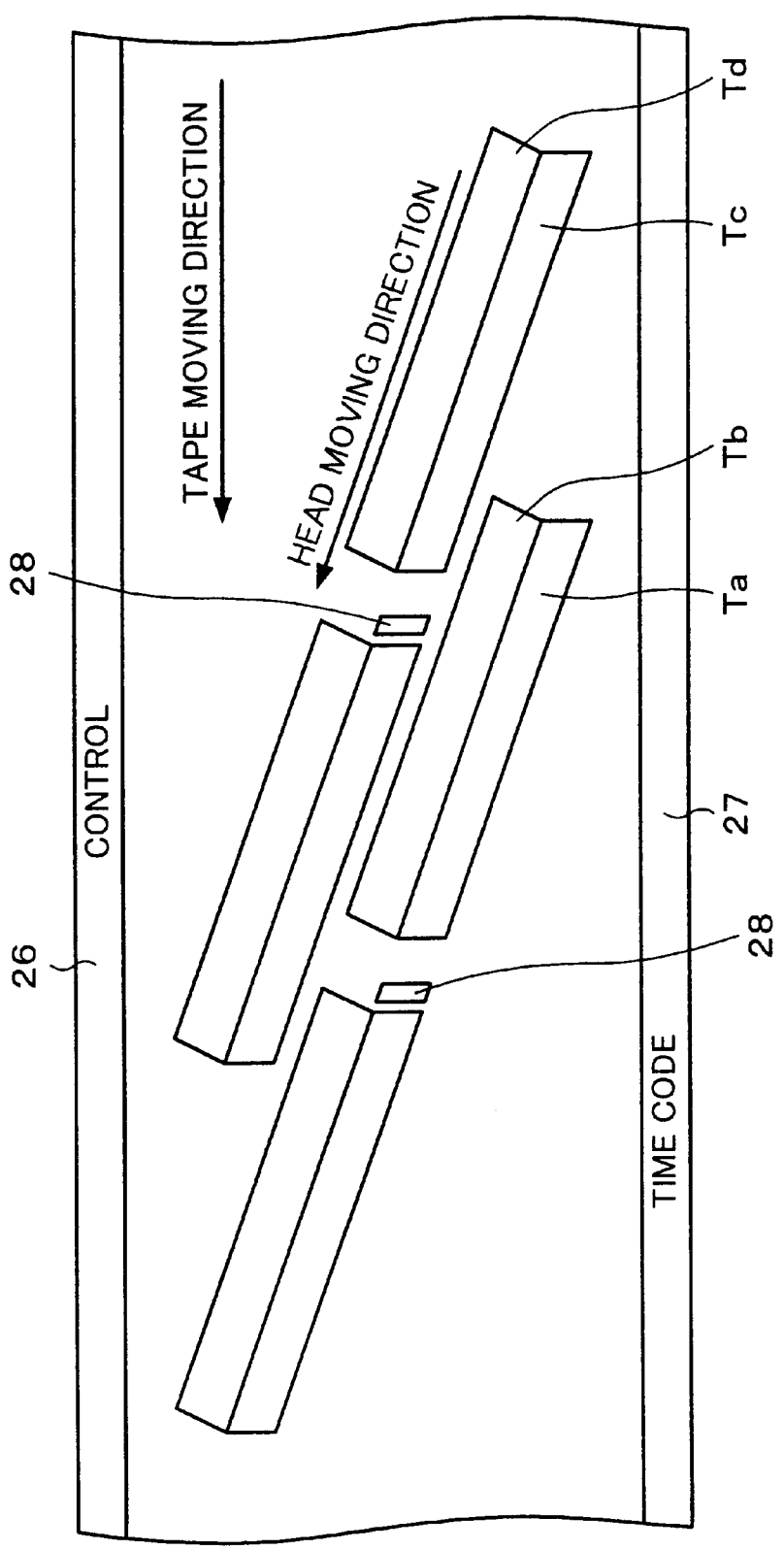
FIG. 3 is a schematic diagram showing a track pattern on a tape of the digital information recorder.

FIG. 3 shows a track pattern on the tape of the digital information recorder 2. Tracks in the longitudinal direction are formed on the tape in upper and lower portions in the width direction of the tape and helical tracks are formed between them. A control signal is recorded on an upper track 26 in the longitudinal direction and a time code is recorded on a lower track 27 in the longitudinal direction. The time code instructs a position on the tape in the longitudinal direction. For example, an SMPTE time code is used. Two helical tracks Ta and Tb are simultaneously formed by the heads Ra and Rb by one rotation of the drum 25. Subsequently, two helical tracks Tc and Td are simultaneously formed by the heads Rc and Rd. In each helical tack, a former half portion and a latter half portion are separately formed and a recording area 28 of a pilot signal for tracking is formed in an intermediate portion between them.

The SMPTE time code has been developed for a video signal of a VTR or the like and its minimum unit is set to frame (1/30 second). As will be explained hereinlater, in the data recorder, four tracks Ta to Td shown in FIG. 3 are set to a data unit (called a track set) to handle recordable data. For example, in the case where 16 tracks correspond to one frame of the video signal, it is necessary to provide a digit (value of 0, 1, 2, or 3) lower than the digit of the frame of the time code and to use a time code (also referred to as an ID) using the track set as a unit. In case of the SMPTE time code, since a user data area is prepared, such a correction is possible.

Figure 4:
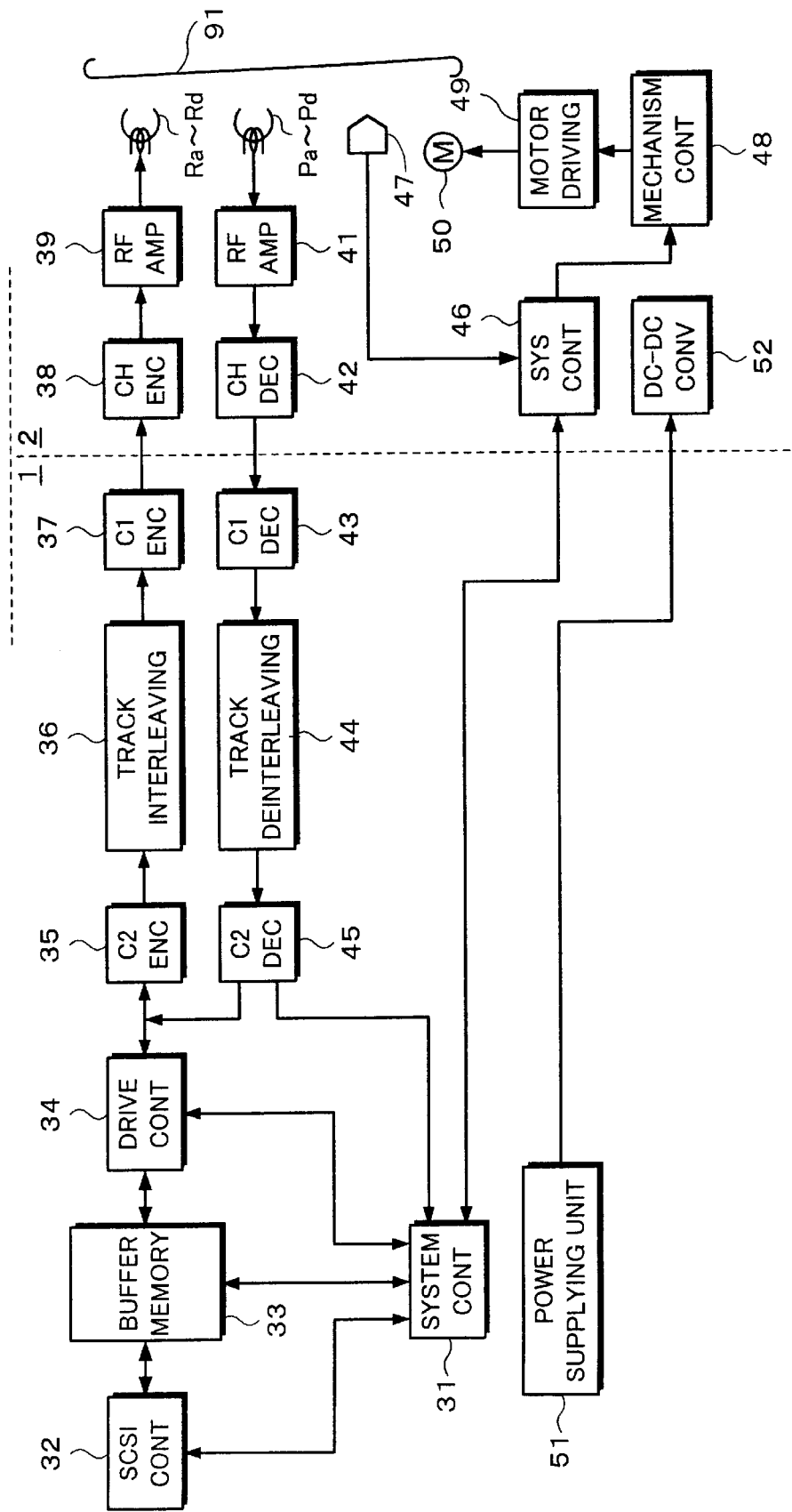
FIG. 4 is a block diagram schematically showing a system construction of a tape drive controller and the digital information recorder.

FIG. 4 schematically shows a system construction of the tape drive controller 1 and digital information recorder 2. There are the following main functions.

Management of an SCSI controller 32

Management of a buffer memory 33

File management/table management

Management of a writing, reading, and retry of data

Control of the digital information recorder 2

Self diagnosis

The data recorder is connected to the host computer 20 via the SCSI controller 32 of the digital information recorder 2. The data read out from the buffer memory 33 is supplied to a C2 encoder 35 via a drive controller 34. The data outputted from the C2 encoder 35 is inputted to a C1 encoder 37 via a track interleaving circuit 36.

The C2 encoder 35 and C1 encoder 37 perform an error correction encoding of a product code to the recording data. The track interleaving circuit 36 controls a distribution to the tracks when the data is recorded onto the tape in order to raise an error correcting ability of errors which are generated in the recording/reproducing processes.

Further, when the data is recorded onto the tape, since an SYNC block divided by a sync signal is set to a unit, in the track interleaving circuit 36, a block sync signal is added. Further, in the C1 encoder 37, after a C1 parity was formed, a process to make the data random and an interleaving process of words in a plurality of SYNC blocks are performed.

The digital data from the C1 encoder 37 is transmitted to the digital information recorder 2. The digital information recorder 2 encodes the digital data received by an encoder 38 of a channel code and outputs the recording data to the recording heads Ra to Rd through an RF amplifier 39. The recording data is recorded onto a tape 91 by the heads Ra to Rd. The RF amplifier 39 executes a process of Partial Response Class 4 (PR(1, 0, −1)).

The data reproduced from the tape 91 by the reproducing heads Pa to Pd is supplied to a decoder 42 of a channel code through an RF amplifier 41. The RF amplifier 41 includes a reproducing amplifier, an equalizer, a Viterbi decoder, and the like. An output of the decoder 42 of the channel code is transmitted to the tape drive controller 1 and is inputted to a C1 decoder 43.

A track deinterleaving circuit 44 is connected to the C1 decoder 43. Further, a C2 decoder 45 is connected to the deinterleaving circuit 44. The C1 decoder 43, track deinterleaving circuit 44, and C2 decoder 45 perform processes opposite to the processes which are performed by the C1 encoder 37, track interleaving circuit 36, and C2 encoder 35, respectively. The C2 decoder 45 supplies the reproduction (read) data to the buffer memory 33 via the drive controller 34 and detects whether the reproduction (read) data differs from the recording data or not. If they are different, an uncorrectable error generation signal is supplied to a system controller 31.

Although not shown in FIG. 4, the system controller 31 can control each unit in the tape drive controller 1. For example, the C2 encoder 35, track interleaving circuit 36, C1 encoder 37, C1 decoder 43, track deinterleaving circuit 44, and C2 decoder 45 are controlled by control signals which are supplied from the system controller 31. Commands and data can be transmitted and received between a system controller 46, which will be explained hereinlater, and the system controller 31.

Further, by operating the various buttons provided for the tape drive controller 1, control signals corresponding to the functions allocated to the various buttons are supplied to the system controller 31. Thus, various operations of the data recorder can be controlled.

The system controller 46 and a fixed head 47 for the track in the longitudinal direction are provided for the digital information recorder 2. The head 47 is connected to the system controller 46. The control signal and the time code are recorded/reproduced by the head 47. The system controller 46 is connected to the system controller 31 of the tape drive controller 1 via a bidirectional bus. In the system controller 31, whether there is error uncorrectable data or not is detected upon recording/reproduction.

A mechanism controller 48 is connected to the system controller 46. The mechanism controller 48 includes a servo circuit and drives a motor 50 through a motor driving circuit 49. The system controller 46 has, for example, two CPUs and performs a communication with the tape drive controller 1, a control of the recording/reproduction of the time code, a control of recording/reproducing timings, and the like.

The mechanism controller 48 has, for example, two CPUs and controls a mechanical system of the digital information recorder 2. More specifically, the mechanism controller 48 performs a control of the rotation of a head • tape system, a control of a tape speed, a control of the tracking, a control of loading/unloading of a cassette tape, and a control of a tape tension. The motor 50 shows as a whole a drum motor, a capstan motor, a reel motor, a motor for loading the cassette, a loading motor, and the like.

Further, a DC-DC converting circuit 52 to which a DC voltage from a power supplying unit 51 of the tape drive controller 1 is inputted is provided. Although not shown in the diagram, position sensors such as a detection sensor of the tape end and the like, a forming/reading circuit of the time code, and the like are provided in the digital information recorder 2.

Figure 5:
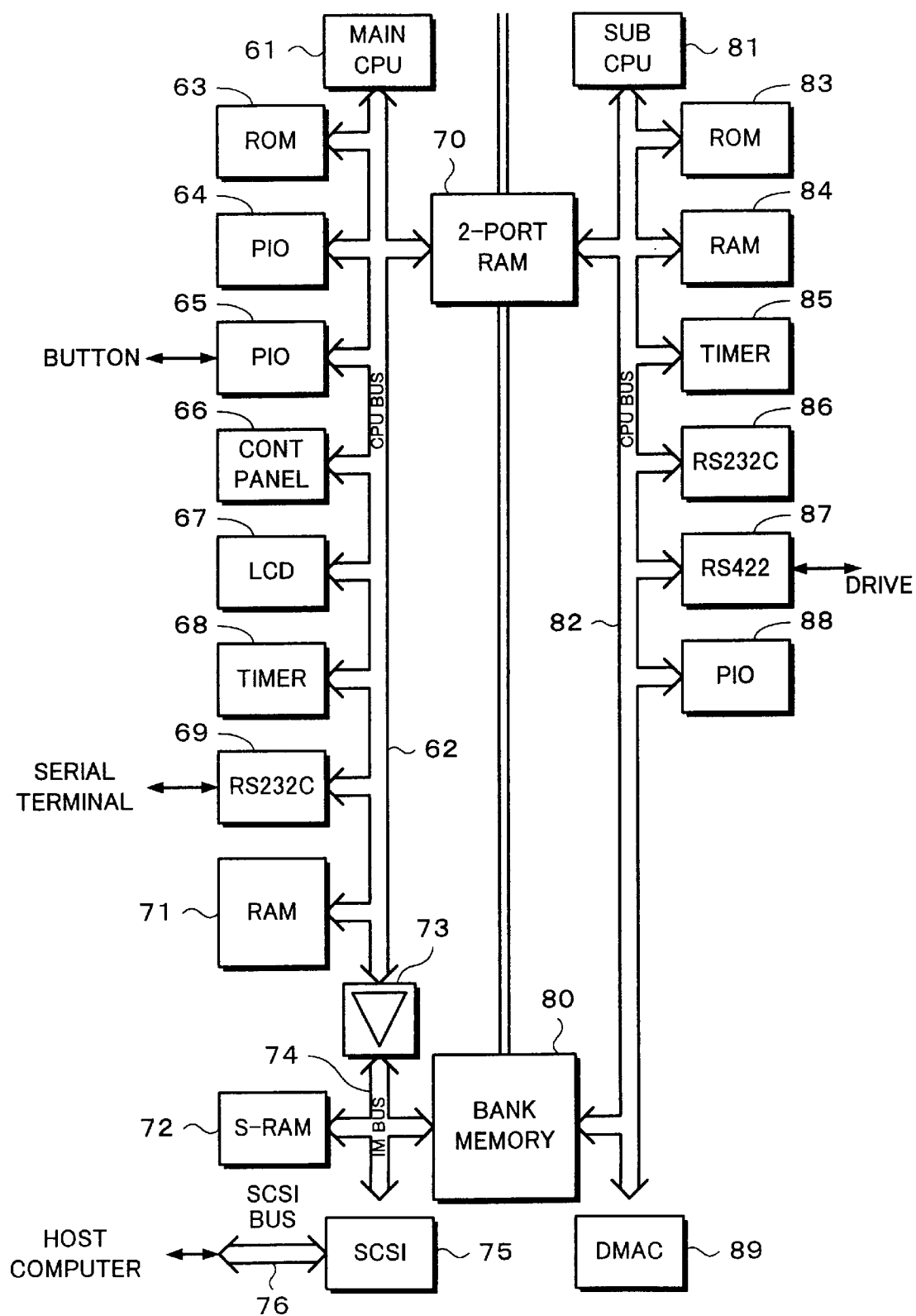
FIG. 5 is a block diagram showing the system construction of the tape drive controller in more detail.

FIG. 5 shows in more detail a system construction of the tape drive controller 1. Reference numeral 61 denotes a main CPU; 70 a 2-port RAM; 80 a bank memory; and 81 a sub CPU. The main CPU 61 is a CPU to manage the whole system. A CPU bus 62 is provided in association with the main CPU 61. Each component element is connected to the CPU bus 62. That is, an ROM (flash ROM) 63, PIOs (parallel I/O) 64 and 65, a control panel 66, an LCD 67, a timer 68, an RS232C interface 69, a 2-port RAM 70, and an RAM 71 are connected to the CPU bus 62.

The PIO 65 is connected to a button on a front panel. The LCD 67 is a liquid crystal display to display an operating situation of the drive so that it can be seen by the user. The RS232C interface 69 is connected to a serial terminal. The RAM 71 has a work RAM that is used in firmware, a download area of a program, and an area to temporarily store header information (VSIT (Volume Set Information Table)/DIT (Directory Information Table)).

An IM bus 74 is connected to the CPU bus 62 via a unilateral control element 73. An S-RAM 72, the bank memory 80, and an SCSI controller 75 are connected to the IM bus 74. A host computer is connected to the SCSI controller 75 through a bus 76. The S-RAM 72 is a capacitor backup RAM, a script RAM, or a memory to actually hold logger data. This memory can hold the data for about two days after the power source was turned off.

Five kinds of packets of a command transmission packet, an end status reception packet, a command status, a drive management status table, and data transmission and reception packet for communication of information between the two CPUs 61 and 81 are stored in the 2-port RAM 70.

The command transmission packet is a packet which is used when the execution of the operation is requested from the CPU 61 to the CPU 81. The end status reception packet is a packet which is used to notify of an end status in the case where the CPU 81 executes the operation in response to the command requested from the CPU 61 and the operation is finished. The command status is a flag to show a progressing status of the command. The drive management status table is a table to notify the CPU 61 of the status of the drive. This table is rewritten at a predetermined period by the CPU 81. The data transmission and reception packet is a buffer which is used in the case where the firmware on the CPU 81 side is downloaded from the CPU 61 side via the SCSI bus 76 or in the case where a self diagnosis (hereinafter, referred to as a "diag") on the CPU 81 side is activated by using the RS-232C interface 69 of the CPU 61. The bank memory 80 is a buffer memory regarding the data.

The sub CPU 81 is a CPU to control the digital information recorder 2. A CPU bus associated with the sub CPU 81 is provided. An ROM (flash ROM) 83, an RAM (work RAM) 84, a timer 85, an RS232C interface 86, an RS422 interface 87, a PIO (processor control) 88, and a DMA controller 89 are connected to a bus 82. Further, the 2-port RAM 70 and bank memory 80 are connected.

The bank memory 80 is a memory to store the data read out from the tape 91 or data to be written onto the tape 91. The DMA controller 89 is a controller to store data into the bank memory 80. The RS232C interface 86 is used for the "diag". The RS422 interface 87 is communicating means with the digital information recorder 2.

A tape format when digital data is recorded will now be described. A layout of the whole tape (for example, tape in one cassette) is first shown in FIG. 6. The whole tape is a physical volume. A recordable area between a start PBOT (Physical Beginning of Tape) of a physical tape and an end PEOT (Physical End of Tape) to each of which a reader tape is connected is located between LBOT (Logical Beginning of Tape) and LEOT (Logical End of Tape). This is because the tape is easily damaged and an error rate is high between the start and end of the tape. For example, an invalid area between PBOT and LBOT is specified to 7.7±0.5 m and an invalid area between PEOT and LEOT is specified to a value larger than 10 m.

A plurality of logical volumes (each logical volume is called a partition) are arranged in one physical volume. To manage one or more logical volumes, a VSIT (Volume Set Information Table) is recorded at the head of the recording area. The VSIT has the number of volumes recorded on the tape and position information of each logical volume on the tape. The position information is a start physical ID and an end physical ID of a DIT (Directory Information Table) of each of up to 1024 logical volumes.

The head position of the VSIT is set to a position of 0-ID. ID (Identification) is an address which is allocated every four track sets and corresponds to the position on the tape. ID is allocated in a monotone increasing manner to a range from the VSIT area to the DIT area of the last volume. A length of one VSIT is equal to 1-ID.

The logical volume comprises a DIT (Directory Information Table), a UIT(User Information Table), and a user data area. The DIT has information to manage files in the logical volume. A length of one DIT is equal to 40-ID. The UIT is an option and is information that is used to manage the files and is peculiar to the user.

Figure 6:
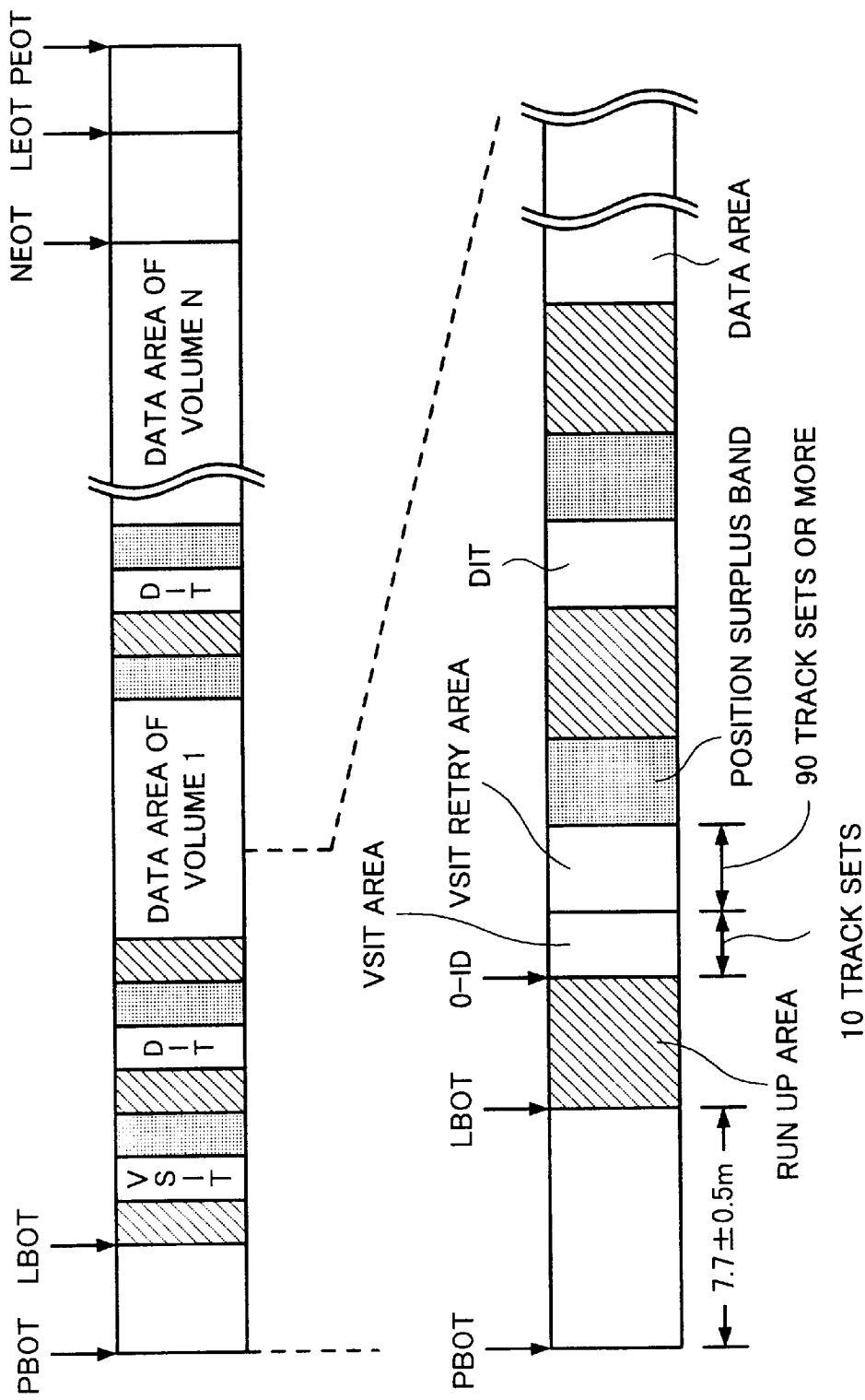
FIG. 6 is a schematic diagram showing a tape format of a cassette tape.

In FIG. 6, a hatched area is a lineup area. The data track is servo locked by the lineup area. A dotted area is a position surplus band. By the position surplus band, it is prevented that the valid data is erased when the VSIT and DIT are updated.

Figure 7A:
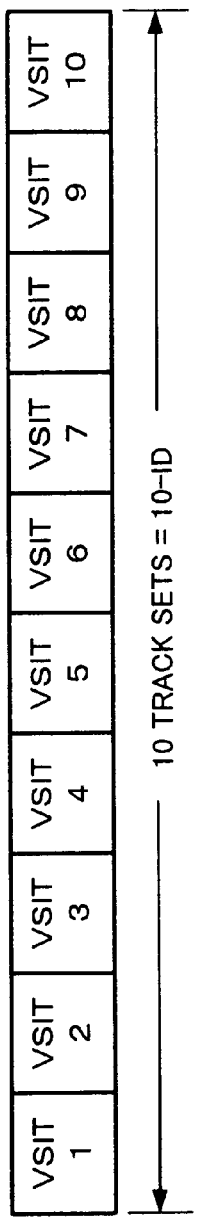
FIGS. 7A, 7B and 7C are schematic diagrams showing formats of VSIT and DIT of the cassette tape.

To improve the reliability of data, the VSIT is repetitively recorded ten times as shown in FIG. 7A. Therefore, the VSIT area is equal to ten track sets (=10-ID). A retry area of 90 track sets or more is assured after the VSIT area.

Figure 7B:
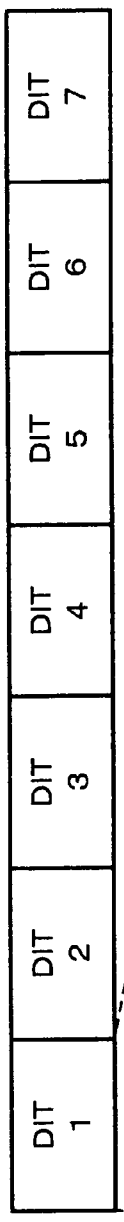
Figure 7C:
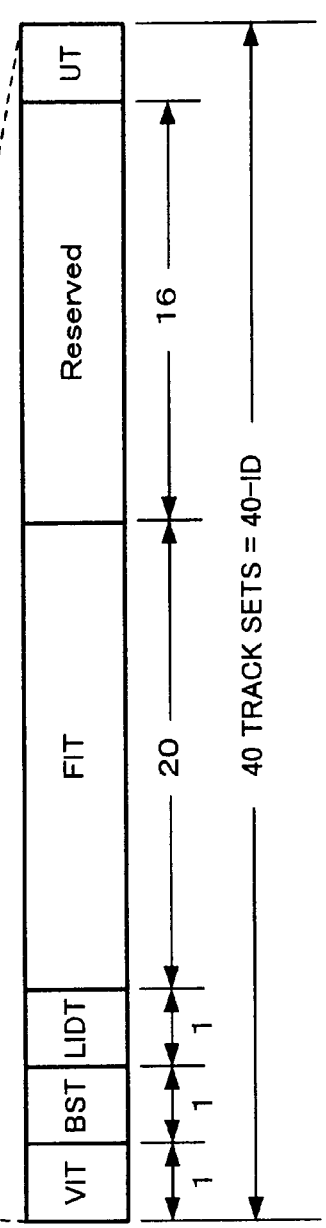

To improve the reliability of the data, the DIT is repetitively recorded seven times as shown in FIG. 7B. The DIT is constructed by six tables as shown in FIG. 7C. The six tables are a VIT (Volume Information Table), a BST (Bad Spot Table), an LIDT (Logical ID Table), an FIT (File Information Table), a UT (Update Table), and a UIT (User Information Table) in accordance with the order from the head. Each of the VIT, BST, LIDT, and UT is equal to a length of 1-ID and the FIT is equal to a length of 20-ID. A remaining area of 16-ID is reserved.

Each table of the DIT will now be explained. An ID address of the VIT is a head physical ID of the volume written in the VSIT and its logical ID is equal to the head physical ID of the volume written in the VSIT. The VIT includes information of the volume such as volume label, start physical ID of the first data block in the physical volume, last physical ID, and the like.

Figure 8:
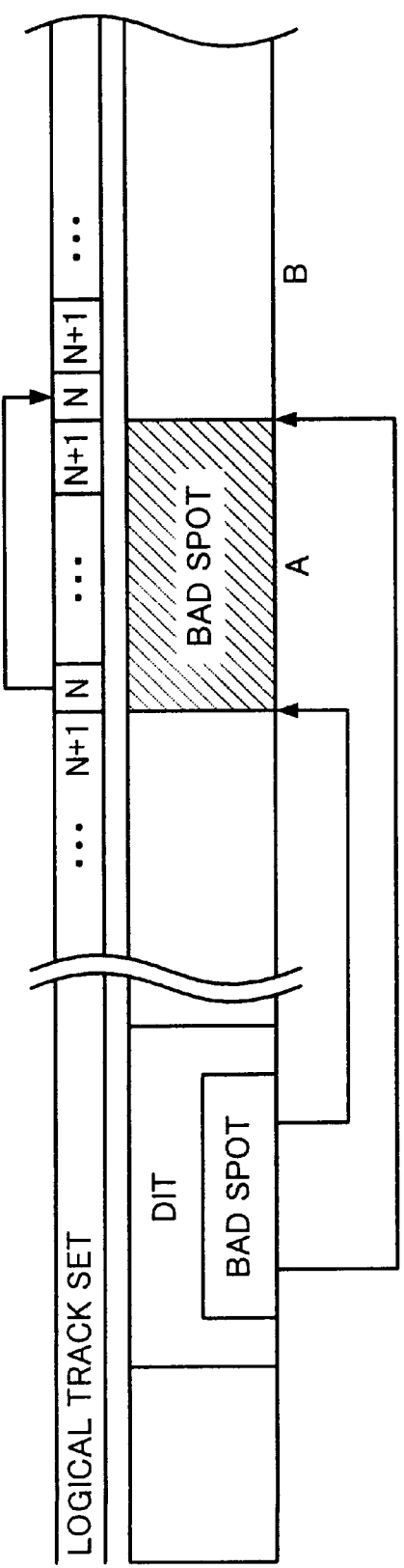
FIG. 8 is a schematic diagram for use in explanation of a bad spot table.

The ID address of the BST is equal to (the physical ID of the VIT) +1 and the logical ID is equal to (the logical ID of the VIT) +1. The BST has the position information of the data which was logically invalidated. The logically invalid data denotes data to be handled as being invalid because the data having the same track set ID is written later. For example, as shown in FIG. 8, a shadow area A is logically invalid data. Logically invalid data is caused by the write retrying operation and the writing operation associated thereto. If an error occurs upon writing, the write retry is automatically performed and an error location is outputted and registered into the BST. An invalid area is instructed by the BST at the time of the reading operation. The logically invalid data is also called a bad spot. The BST manages the start physical IDs and end physical IDs of up to 14592 bad spots.

The ID address of the LIDT is equal to (the physical ID of the VIT) +2 and its logical ID is equal to (the logical ID of the VIT) +2. The LIDT is a data table for a high speed block space and a locating operation. That is, the logical ID of each of the first to 296th pointers, its physical ID, a file number, and a first block number in the block management table of the ID data are included in the LIDT.

The ID address of the FIT is equal to (the physical ID of the VIT) +3 and its logical ID is equal to (the logical ID of the VIT) +3. The FIT comprises a plurality of pairs each consisting of two kinds of data corresponding to tape marks. The tape mark is a delimiter code (code for delimiter) of the file. The Nth data pair corresponds to the Nth tape mark from the head of the volume. One of the data of the pair is the physical ID of the Nth tape mark. The other data is the absolute block number of the Nth tape mark. This value indicates the absolute block number of the last block having the same file number as the tape mark. Since the position of the tape mark is correctly known by the physical ID of the tape mark and the absolute block number, the physical position on the tape can be accessed at a high speed.

The ID address of the UT is equal to (the physical ID of the VIT) +39. The UT denotes information showing whether the volume has been updated or not. Before updating, a word (4 bytes) showing an updating status in the UT is set to FFFFFFFFh (h denotes a hexadecimal notation). After the updating, it is set to 00000000h.

The UIT is optional and is, for example, an area of 100-ID. It is a data table that can be accessed by the user and is assured for a user header.

Figure 9:
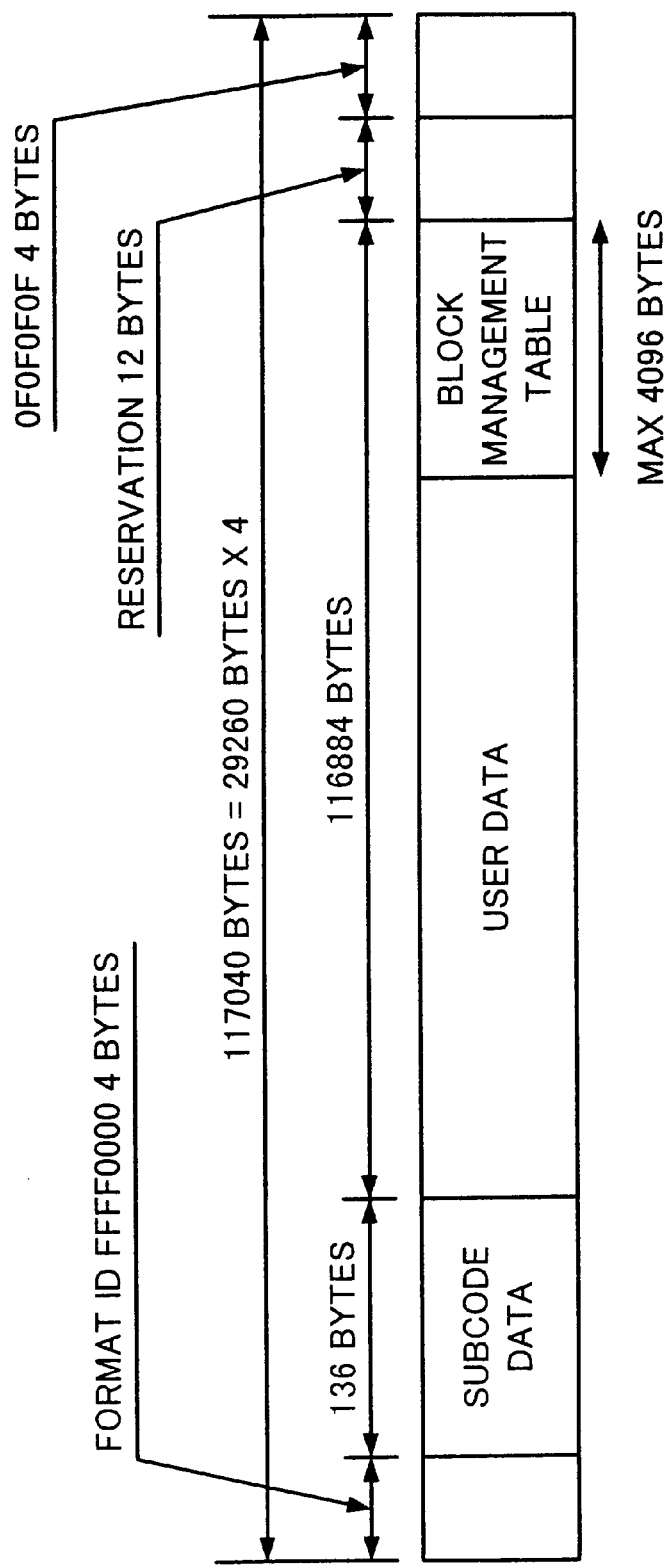
FIG. 9 is a schematic diagram for explaining a logical format of the cassette tape.

In this example, 1-ID is allocated every track set comprising four helical tracks. A logical structure of the data block is specified every track set. FIG. 9 shows a logical track set structure. Four bytes at the head of the logical track set indicate a format ID and it is set to FFFF0000h.

Next 136 bytes (34 words) denote an area of subcode data. As for the subcode data, information on management of the track sets is stored. For example, the foregoing tables (VSIT, VIT, BST, etc.), user data, and ID code such as a tape mark or the like are included in the subcodes.

The bytes of the number in which the length of block management table is subtracted from the further next 116884 bytes corresponds to a writing area of the user data. Now assuming that the track set is used for writing the user data, when the size of user data does not reach a specified size, dummy data is filled into the remaining area. As formats of the track sets that are defined in the user data area, there are four kinds of formats of a user data track set to write the user data, a tape mark (TM) track set to show the tape mark, an EOD (End Of Data) track set, and a dummy track set. A subcode is specified every format of the track set.

A block management table area is provided after the user data area. The block management table is set to a length of up to 4096 bytes. Last four bytes of the track set are set to an end code (0F0F0F0Fh) of the track set and 12 bytes before them are reserved. In the block management table, the data block construction of the user data is managed.

Figure 10:
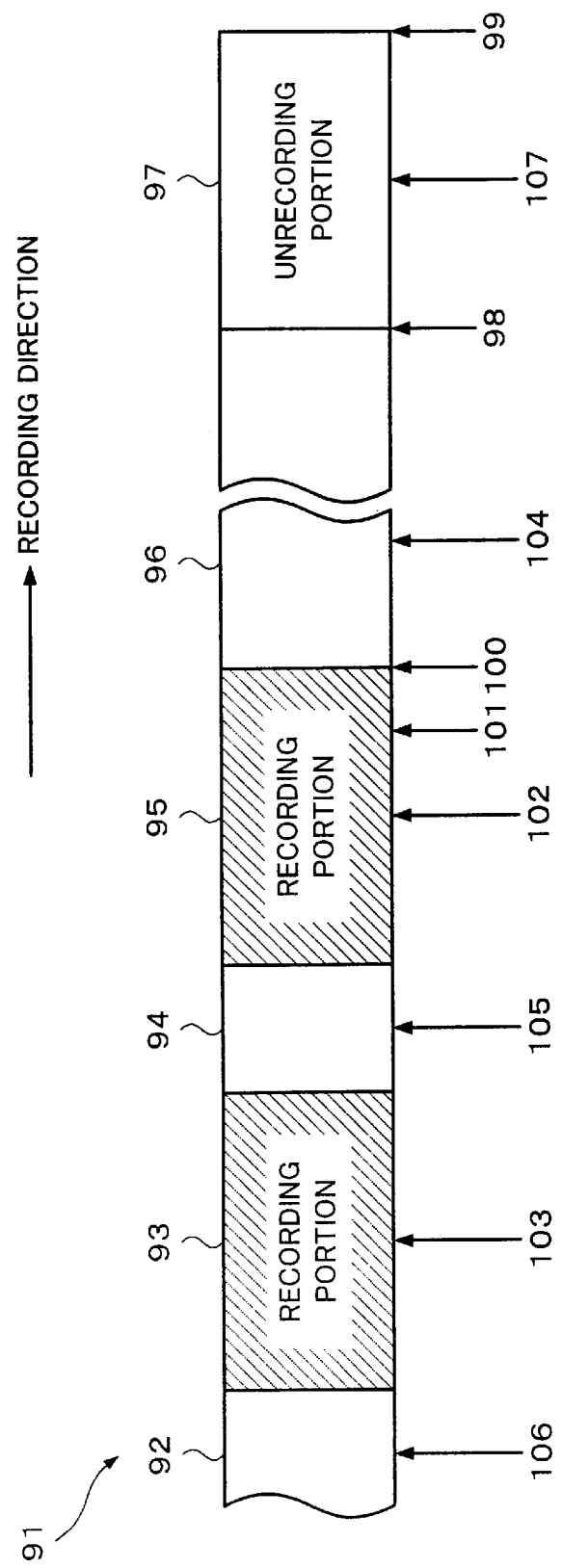
FIG. 10 is a schematic diagram showing a magnetic tape in case of recording data by using the data recorder.

FIG. 10 is a diagram showing a magnetic tape in case of recording data by using the data recorder. In FIG. 10, data is recorded onto the magnetic tape 91 in the recording direction shown in the diagram. The magnetic tape 91 includes: an invalid data portion (including an unrecorded portion) 92; a recording portion 93 where data has already been recorded; an invalid data portion (including an unrecorded portion) 94 locating between the recording portion 93 and a recording portion 95; the recording portion 95 during the recording of the data; an invalid data portion (including an unrecorded portion) 96 locating immediately after the recording portion 95; and an unrecorded portion 97 where no data is recorded between an end 98 of the logical tape and an end 99 of the physical tape.

While the data is being recorded into the recording portion 95, when an uncorrectable error is detected by the C2 decoder 45 at an uncorrectable error generation point 100 upon recording as a result of the execution of a signal process, data at positions near the position just before the error generation point 100 is invalidated. Data to be recorded into the recording portion 95 is newly recorded.

The write retrying operation of the data to the magnetic tape 91 will now be described hereinbelow. Explanation will now be made hereinbelow on the assumption that the data has already been recorded into the recording portion 95 and that an uncorrectable error was generated at the error generation point 100. It is also assumed that the write retrying operation is performed, for example, up to ten times until the data is accurately recorded.

In the write retrying process, the magnetic tape 91 is prerolled to a preroll point 102 of the recording portion 95. When the uncorrectable error is detected by the C2 decoder 45, it is regarded that the data at the positions near the position just before the error generation point could not be recorded. The recording portion 95 is set to the bad spot and is registered into the BST. The preroll point 102 is a start point of an area that is needed as a speed control interval of the tape when link photographing from the error generation point 100 and is a point which is set by using the present position of the tape as a reference. An interval between the preroll point 102 and error generation point 100 is set to a length which is at least necessary to servo lock for recording.

When the cassette tape is loaded, the digital data information is read out from the DIT recorded on the magnetic tape 91 by the system controller 31. When an uncorrectable error is detected by the C2 decoder 45, the C2 decoder 45 generates an uncorrectable error generation signal to the system controller 31. On the basis of the information of the DIT, the system controller 31 generates a control signal to the motor driving circuit 49 in response to such a signal. The motor 50 is driven by this control signal and the magnetic tape 91 is prerolled to the preroll point 102. Further, the write retry is performed just after the magnetic tape was advanced to the error generation point 100 (invalid data portion).

The preroll can be also performed up to a preroll point 103 without limiting to the preroll point 102. Even in this case, the write retry is further performed just after the magnetic tape was advanced to the error generation point 100.

An ID counter can be used to obtain a position on the magnetic tape 91. The ID counter counts a relative length of the tape in which an ID calculated by a servo circuit included in the mechanism controller 48 (refer to FIG. 4) on the basis of a length of the outermost diameter of the magnetic tape 91 and an angle of rotation of a reel is set to a unit. A value of 1-ID recorded on the tape corresponds to one count of the ID counter. By using the ID counter, a head search of the tape in which the ID is used as a unit can be performed at predetermined precision even for a tape in which data is not preliminarily recorded.

By using the ID counter, it is also possible to construct such that the magnetic tape 91 is fast-forwardly fed to a search point 104 existing in the invalid data portion 96 and, after that, it is returned to the preroll point 102, the tape is further advanced to the error generation point 100, and the write retry is executed. Similarly, the magnetic tape 91 can be also rewound up to a search point 105 existing in the invalid data portion 94 or a search point 106 existing in the invalid data portion 92. The magnetic tape 91 can be also fast-forwardly fed to a search point 107 existing in the unrecorded portion 97.

Even if a head clog occurs when the recording portion 95 is being reproduced, the magnetic tape 91 is also prerolled, rewound, or fast-forwardly fed by a method similar to that upon recording. For example, at the time of reproduction, when an error is detected at an uncorrected error point 101 upon reproduction, the magnetic tape is prerolled, rewound, or fast-forwardly fed by the above method and a read retry of the data from a point before the error point 101 is performed.

The read retry of the data from the point before the error point 101 can be also performed from the start of the data. It is assumed that the read retry of the data is executed, for example, up to five times until it is correctly reproduced. The above six methods can be individually performed or a combination of a plural number of them can be also performed. By combining the above methods, the head clog can be more certainly eliminated. With respect to a discrimination about in which one of the fast-forward feeding direction and the rewinding direction the tape is moved, the tape is moved, for example, in the direction of a preroll point or a search point which is nearer to the error point.

Processes of instrumental data according to the embodiment of the invention will now be described in comparison with the processes of the ordinary data. First, the writing of data to the magnetic tape 91 will be described.

When data is written to the magnetic tape 91 by the four heads Ra, Rb, Rc, and Rd for recording, the written data is read out by the four heads Pa, Pb, Pc, and Pd for reproduction just after it, for example, after the drum 25 was rotated by 90°. The read data is processed on a block unit basis of a predetermined size, for instance, 31ID.

That is, the data read out from the magnetic tape 91 is subjected to a decoding of a C1 parity by the C1 decoder and is subjected to a decoding of a C2 parity by the C2 decoder via the track deinterleaving circuit 44. An error correction code of a product code is decoded and an error correction is performed. An error correction result is supplied to the system controller 31.

If all of the errors can be corrected by the error correction, the data in the relevant block is regarded as normal data. If errors exceeding an error correcting ability of the error correction code exist, the errors cannot be corrected and the data in this block is regarded as abnormal data.

Figure 11:
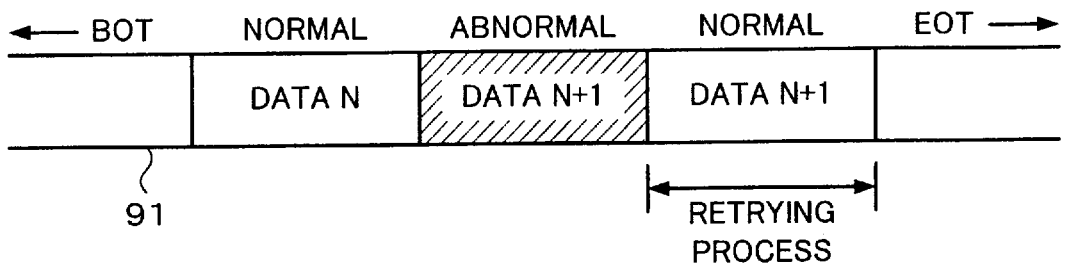
FIG. 11 is a schematic diagram for explaining a writing process of normal data.
Figure 12:
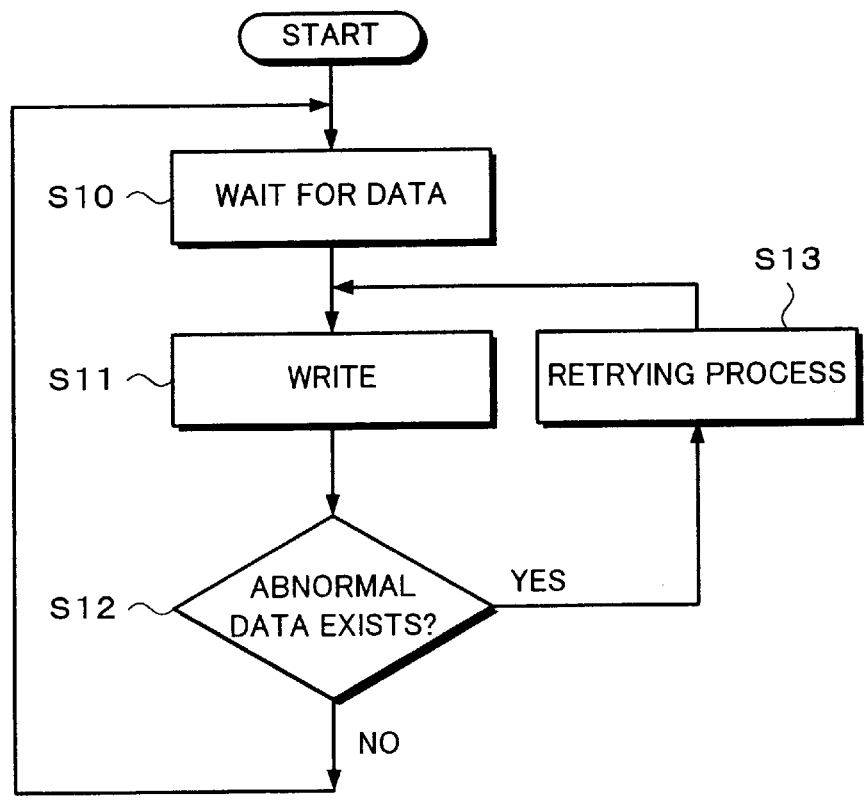
FIG. 12 is a schematic flowchart for the writing process of the normal data.

FIG. 11 shows a writing process of the normal data. FIG. 12 shows a schematic flowchart for this process. In an example of FIG. 11, it is assumed that data of a block shown by data N is normal data and data of a block shown by next data N+1 is abnormal data. In case of writing the normal data, if the block of the abnormal data exists, a retrying process is performed. For instance, the data N+1 is continuously rewritten after the block decided as being abnormal.

That is, as shown in the flowchart of FIG. 12, first in step S10, the process is waited until a predetermined amount of data is stored in the buffer memory 33. When the data is stored, it is written onto the magnetic tape 91 in step S11. The written data is read out just after that and an error correction is performed. If the data is decided to be normal as a result of the error correction (step S12), the processing routine is returned to step S10.

If the data is determined to be abnormal as a result of the error correction in step S12, the processing routine advances to step S13. In step S13, the retrying process is performed and the magnetic tape 91 is moved to a position where the data is rewritten. In step S11, the same data as that in the previous time is rewritten from this position. Upon writing of the normal data, it is processed so as not to lose the data.

Figure 13:
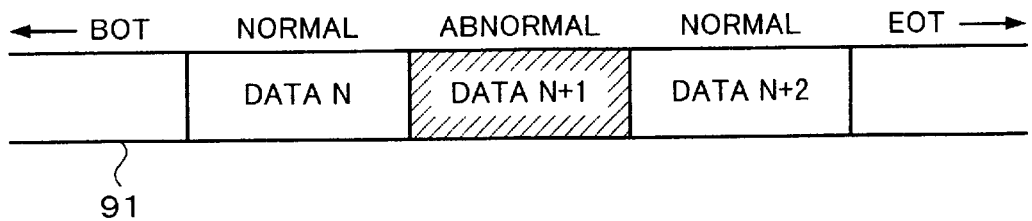
FIG. 13 is a schematic diagram for explaining a writing process of instrumental data according to the invention.
Figure 14:
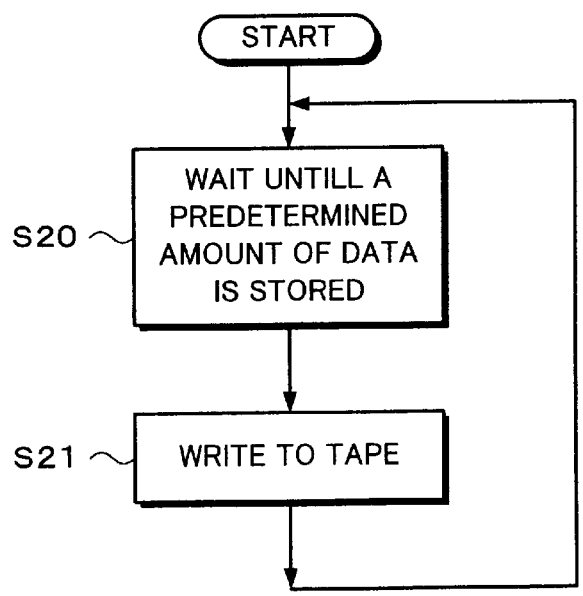
FIG. 14 is a schematic flowchart for the writing process of the instrumental data according to the invention.

On the other hand, according to the invention, even if an error uncorrectable block exists when the instrumental data is written, the data is not rewritten. FIG. 13 shows a writing process of the instrumental data according to the invention. FIG. 14 shows a schematic flowchart for this process.

When the instrumental data is written, as shown in FIG. 13, for instance, even if the block shown by the data N+1 is an error uncorrectable block and is abnormal, the retrying process is not performed. Subsequent to the block of the data N+1, a block shown by data N+2 as next data is written.

That is, as shown in the flowchart of FIG. 14, the process is waited until a predetermined amount of data is stored in the buffer memory 33. The stored data is written onto the magnetic tape 91 in step S21. Processes in steps S20 and S21 are repeated. It is not particularly necessary to perform an error correcting process in association with the writing.

Figure 15:
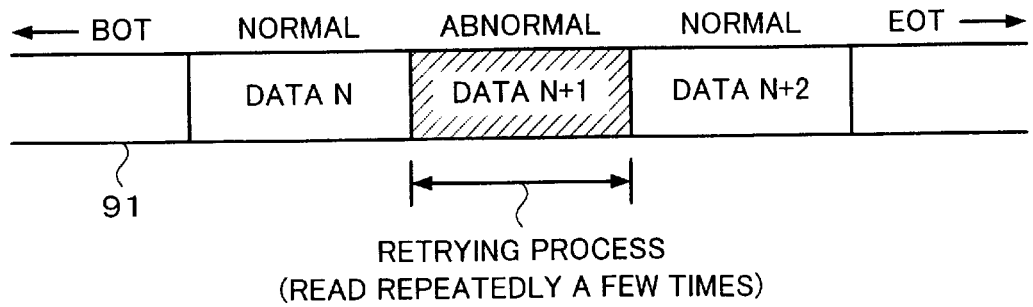
FIG. 15 is a schematic diagram for explaining a reading process of normal data.
Figure 16:
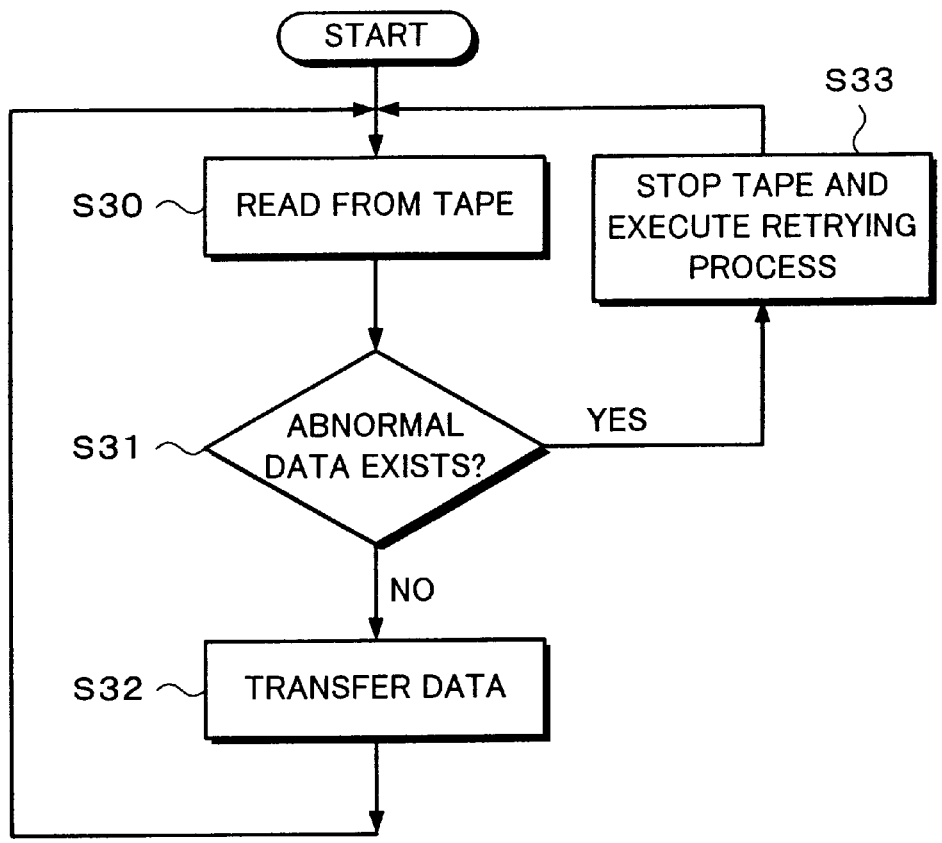
FIG. 16 is a schematic flowchart for the reading process of the normal data.

The reading of the data from the magnetic tape 91 will now be described. FIG. 15 shows a reading process of normal data. FIG. 16 shows a schematic flowchart for this process. In a manner similar to the case upon writing mentioned above, the data read out by the four heads Pa, Pb, Pc, and Pd for reproduction is subjected to an error correcting process on a block unit basis of a predetermined size of, for example, 31ID. When errors exceeding the error correcting ability of the error correction code exist, the data of this block is regarded as abnormal data.

In case of reading the normal data, as shown in an example in FIG. 15, now assuming that the data of the block of data N+1 is regarded as abnormal data, this block is repetitively read out by the retrying process. If the uncorrectable errors were generated due to a cause such as choking of any one of the four reproducing heads Pa, Pb, Pc, and Pd, fouling of the surface of the magnetic tape 91, or the like, there is a case where the errors are eliminated by repetitively reading the data. This process is performed, for instance, a plural number of times and the next block is read at a stage when the errors are eliminated.

That is, when a predetermined amount of data is read out from the magnetic tape 91 in step S30, an error correcting process is performed. In step S31, whether the block relates to the abnormal data or not is discriminated. If the block is decided to be normal data, the processing routine advances to step S32. The read data is transferred to, for instance, the host computer 20 via the SCSI controller 32.

If the block is decided to be abnormal data in step S31, the processing routine advances to step S33 and the retrying process is performed. The retrying process is performed by once stopping the tape and returning to the head of the block which was decided as abnormal data. In step S30, the data of the block is again read.

Figure 17:
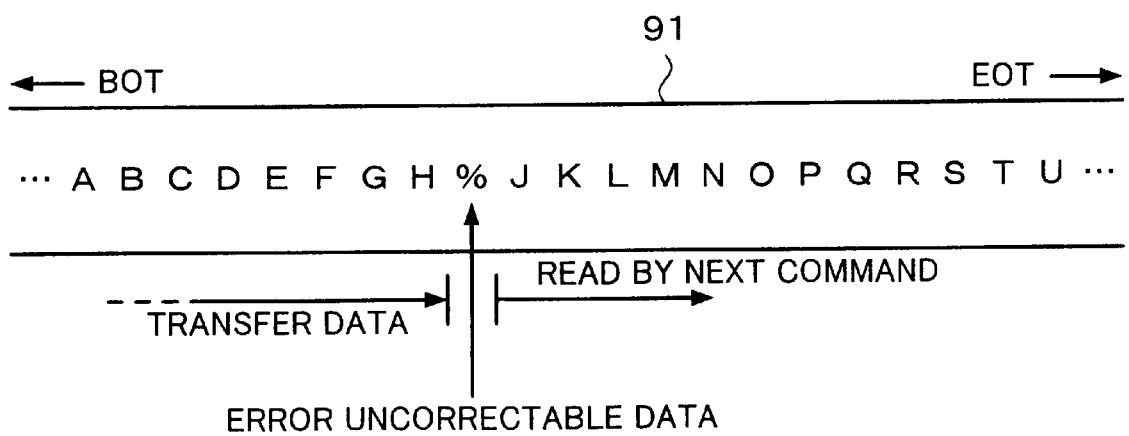
FIG. 17 is a schematic diagram for explaining another example of a process when the normal data is read.
Figure 18:
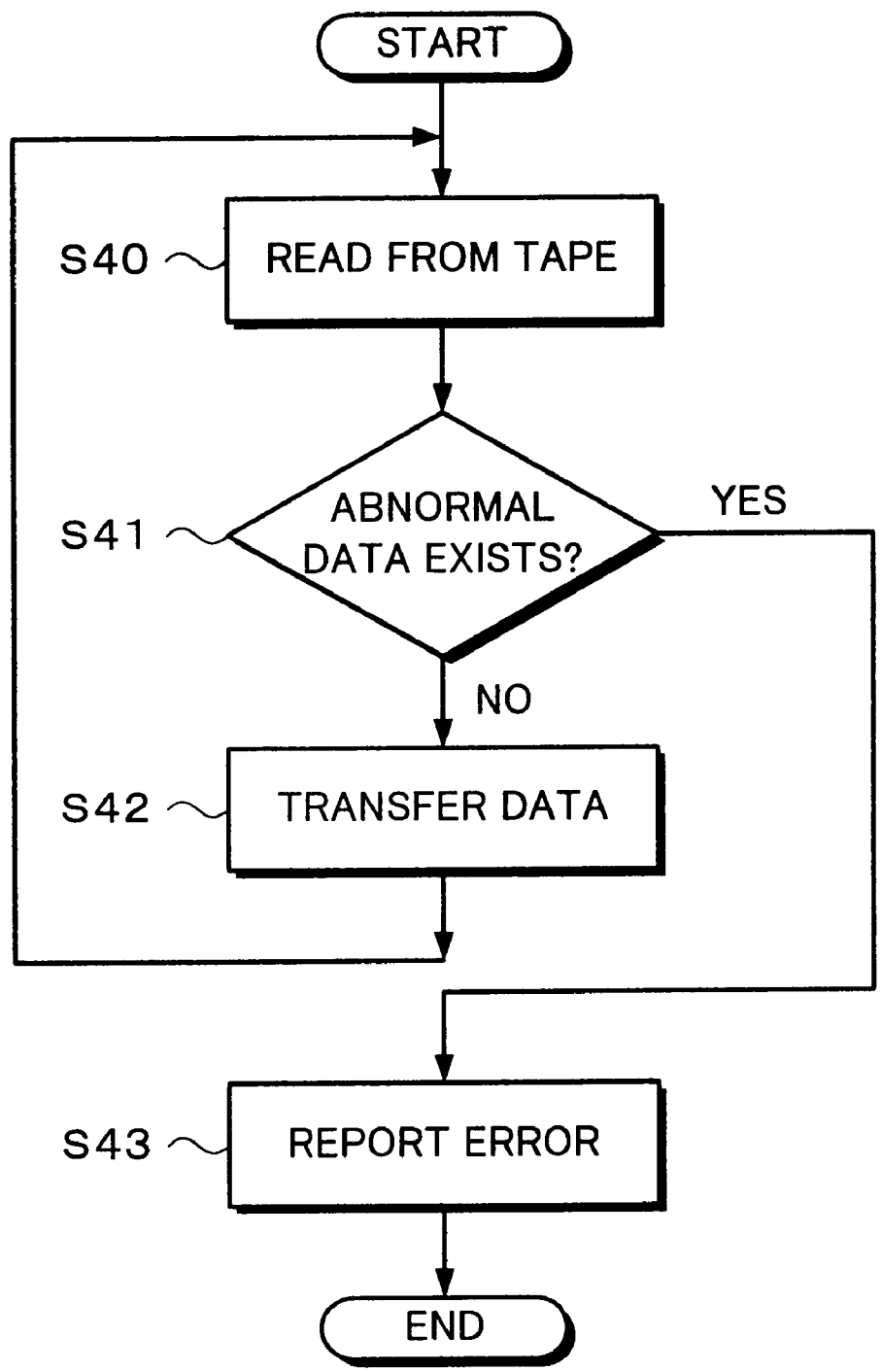
FIG. 18 is a schematic flowchart for another example of a process when the normal data is read.

FIG. 17 shows another example of a process when the normal data is read. FIG. 18 shows a flowchart for an example of this process. FIG. 17 conceptually shows a state as if a data train "A, B, C, . . . " was written on the magnetic tape 91. Data A to H is error correctable data and the read data is error corrected and is transferred. Data that is shown by "%" and is next to the data H is the error uncorrectable data. When the data % is determined to be error uncorrectable, for example, an error is reported to the host computer 20 and the process is waited until a next read command is generated. The data J and subsequent data are read on the basis of a next read command.

That is, when a predetermined amount of data is read out from the magnetic tape 91, an error correcting process is performed. In step S41, whether the block relates to the abnormal data or not is discriminated. If the block is determined to be normal data, the processing routine advances to step S42 and the read data is transferred to, for instance, the host computer 20 via the SCSI controller 32.

If the block is decided to be abnormal data in step S41, the processing routine advances to step S43 and, for example, an error is reported to the host computer 20. The process is once finished and is waited until a next read command is generated. As mentioned above, when the normal data is read, the process is performed so that the certain data is transferred to the host computer 20.

On the other hand, in the invention, even if the error uncorrectable block and data exist when the instrumental data is read, the rereading of the data, the stop of the process, and the like are not performed. FIGS. 19 show the reading process of instrumental data according to the invention. FIG. 20 shows a schematic flowchart for this process.

Figure 19A:
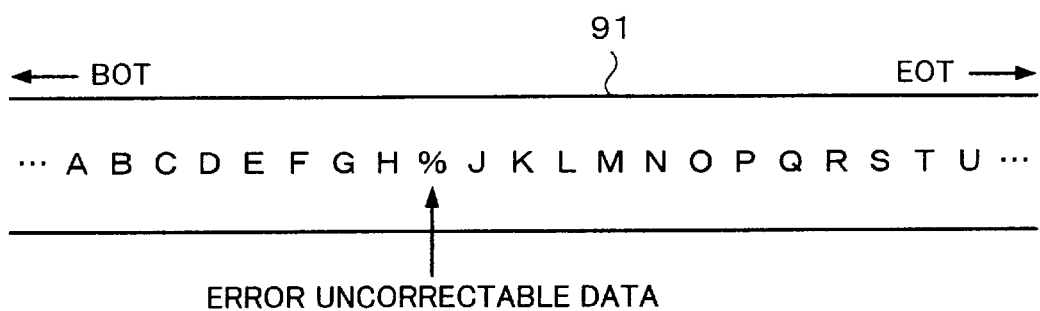
FIGS. 19A and 19B are schematic diagrams for explaining a reading process of instrumental data according to the invention.
Figure 19B:
Figure 20:
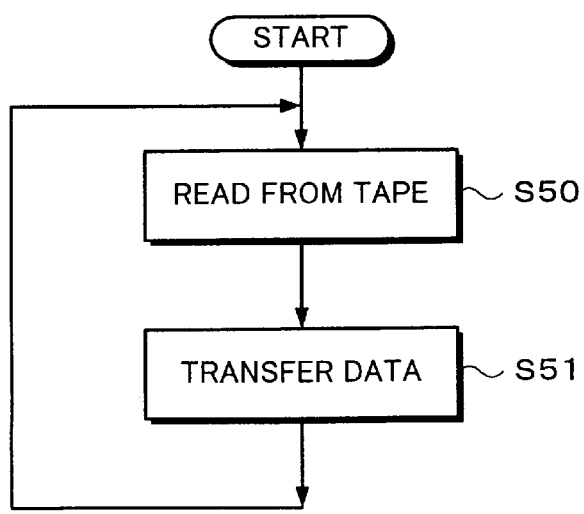
FIG. 20 is a schematic flowchart for the reading process of the instrumental data according to the invention.

As shown in FIG. 19A, it is now assumed that the data % is error uncorrectable data on the magnetic tape 91 in a manner similar to the foregoing case of the normal data. Upon reading of the instrumental data, as shown in FIG. 19B, all of data including the error uncorrectable data % is continuously transferred. The data is transferred to, for instance, the host computer 20 via the SCSI controller 32.

That is, as shown in the flowchart of FIG. 20, the data is read out from the magnetic tape 91 (step S50). An error correcting process is performed to the read-out data and the data is transferred irrespective of a correction result (step S51). The processes in steps S50 and S51 are repeated. Thus, the data is continuously transferred as shown in FIG. 19B. Even if it is decided to be error uncorrectable as a result of the error correction, the error is not reported to the host computer 20 or the like.

The process for the normal data and the process for the instrumental data are switched by, for example, operating a predetermined one of various buttons which are provided on the tape drive controller 1 and are used to operate the data recorder. In the system controller 31, on the basis of the signal supplied by the operation of the predetermined button, a predetermined command is issued to the system controller 46 and a predetermined control signal is supplied to each unit which is controlled by the system controller 31. Similarly, in the system controller 46, on the basis of the command supplied from the system controller 31, a predetermined control signal is supplied to each unit which is controlled by the system controller 46. Each unit of the data recorder is controlled as mentioned above and the modes are switched.

The mode switching is not limited to the above example and, for example, can be performed by a command from the host computer 20 connected to the data recorder.

According to the invention, as described above, since the retrying process at the time of writing and reading is not performed, there is an effect such that it is possible to cope with a system in which the continuous recording and reproduction are required as in case of handling the instrumental data.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A digital data recording and reproducing apparatus for recording or reproducing inputted digital data, comprising:

a memory to temporarily store said inputted digital data;

recording processing means for performing an encoding for error correction to the digital data read out from said memory and recording the encoded digital data onto a recording medium;

reproduction processing means for reproducing said encoded signal recorded on said recording medium and performing a decoding of said error correction;

confirming means for, when recording a signal onto said recording medium, instantaneously reproducing the recorded signal and confirming an error state of the signal recorded on said recording medium;

drive control means for controlling a driving of said recording medium; and a system controller for controlling said memory, said recording processing means, said reproduction processing means, said confirming means, and said drive control means so that the signal is recorded onto or reproduced from said recording medium in response to a control signal that is selected, wherein said apparatus further comprises:

retry means for controlling said memory, said recording processing means, and said drive control means when the signal is recorded onto said recording medium in a manner such that the digital data which had been stored in said memory and has already been read out for recording from said memory is again read out and is again recorded onto said recording medium by said recording processing means in accordance with a confirmation result of said confirming means and for controlling said reproduction processing means and said drive control means when the signal is reproduced from said recording medium in a manner such that an area on said recording medium which has already been reproduced is again reproduced in accordance with a result of said error correction by said reproduction processing means;

mode selecting means for selecting a first processing mode and a second processing mode in accordance with a kind of said inputted digital data or said digital data which is reproduced from said recording medium; and retry processing control means for controlling on the basis of a selection result of said mode selecting means in a manner such that a retrying process by said retry means is executed in case of said first processing mode and the retrying process by said retry means is not performed in case of the second processing mode.

2. An apparatus according to claim 1, wherein said mode selecting means selects:

said first processing mode in the case where said inputted digital data is ordinary data which doesn't need to be time-sequentially recorded onto said recording medium on a recording unit basis or in the case where the digital data that is reproduced from said recording medium is said ordinary data which doesn't need to be time-sequentially recorded onto said recording medium on a recording unit basis; and said second processing mode in the case where although said inputted digital data that is not corrected by said error correction as the practical performance, said digital data is data which needs to be recorded onto said recording medium and needs to be time-sequentially recorded onto said recording medium on a recording unit basis, or in the case where although the digital data that is reproduced from said recording medium is said data that is not corrected by said error correction as the practical performance, said digital data is data which needs to be recorded onto said recording medium and needs to be time-sequentially recorded onto said recording medium on a recording unit basis.

3. An apparatus according to claim 2, wherein said mode selecting means selects said second processing mode in the case where said inputted digital data or the digital data that is reproduced from said recording medium is instrumental data.

4. An apparatus according to claim 1, wherein said system controller further has error report control means for controlling whether an error report according to said error correction result is executed or not on the basis of the selection result of said mode selecting means.

5. A digital data reproducing apparatus for reproducing a signal recorded on a recording medium, comprising:

reproduction processing means for reproducing an error correction encoded signal recorded on said recording medium and performing a decoding of said error correction;

drive control means for controlling a driving of said recording medium; and a system controller for controlling said reproduction processing means and said drive control means so as to reproduce the signal from said recording medium in response to a control signal that is selected, wherein said apparatus further comprises:

retry means for controlling said reproduction processing means and said drive control means when the signal is reproduced from said recording medium in a manner such that an area on said recording medium which has already been reproduced is again reproduced in accordance with a result of said error correction of said reproduction processing means;

mode selecting means for selecting either a first processing mode or a second processing mode in accordance with a kind of digital data that is reproduced from said recording medium; and retrying process control means for controlling on the basis of a selection result of said mode selecting means in a manner such that a retrying process by said retry means is executed in case of said first processing mode and the retrying process by said retry means is not performed in case of said second processing mode.

6. An apparatus according to claim 5, wherein said mode selecting means selects:

said first processing mode in the case where the digital data which is reproduced from said recording medium is ordinary data which doesn't need to be time-sequentially recorded onto said recording medium on a recording unit basis; and said second processing mode in the case where although the digital data which is reproduced from said recording medium is data that is not corrected by said error correction as the practical performance, said digital data is data which needs to be recorded onto said recording medium and needs to be time-sequentially recorded onto said recording medium on a recording unit basis.

7. An apparatus according to claim 6, wherein said mode selecting means selects said second processing mode in the case where the digital data which is reproduced from said recording medium is instrumental data.

8. An apparatus according to claim 5, wherein said system controller further has error report control means for controlling whether an error report according to said error correction result is executed or not on the basis of the selection result of said mode selecting means.

* * * * *